(12) United States Patent
Lin et al.

(10) Patent No.: US 11,133,187 B2
(45) Date of Patent: Sep. 28, 2021

(54) METHODS FOR FORMING A PHOTO-MASK AND A SEMICONDUCTOR DEVICE

(71) Applicant: Winbond Electronics Corp., Taichung (TW)

(72) Inventors: Chun-Hung Lin, Chiayi (TW); Ching-Chun Huang, Taichung (TW); Chung-Chen Hsu, Taitung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 266 days.

(21) Appl. No.: 16/046,069

(22) Filed: Jul. 26, 2018

(65) Prior Publication Data

US 2019/0051527 A1 Feb. 14, 2019

(30) Foreign Application Priority Data

Aug. 9, 2017 (CN) .......................... 201710674588.2

(51) Int. Cl.
*G03F 1/68* (2012.01)
*G03F 1/70* (2012.01)
(Continued)

(52) U.S. Cl.
CPC .............. *H01L 21/266* (2013.01); *G03F 1/00* (2013.01); *G03F 1/68* (2013.01); *G03F 1/70* (2013.01); *H01L 21/0274* (2013.01)

(58) Field of Classification Search
CPC ..... G03F 1/00; G03F 1/90; G03F 1/54; H01L 21/0274; H01L 21/266
See application file for complete search history.

(56) References Cited

U.S. PATENT DOCUMENTS 3,669,666 A * 6/1972 Klietman et al. ......... G03F 1/90
355/77
4,343,877 A * 8/1982 Chiang ............... G03F 7/70541
257/48
(Continued)

FOREIGN PATENT DOCUMENTS

CN 1423170 A 6/2003
JP 58-203443 * 11/1983
(Continued)

OTHER PUBLICATIONS

Machine translation of JP 10-253986 (Sep. 1998).*
(Continued)

*Primary Examiner* — Martin J Angebranndt
(74) *Attorney, Agent, or Firm* — Muncy, Geissler, Olds & Lowe, P.C.

(57) ABSTRACT

A method for forming a photo-mask includes providing a first pattern, wherein the first pattern includes a first light-transmitting region and a first light-shielding region; transforming the first pattern into a second pattern, wherein the second pattern includes a second light-transmitting region and a second light-shielding region, the second light-transmitting region is located within range of the first light-transmitting region, and the second light-transmitting region has an area which is smaller than that of the first light-transmitting region, the second light-shielding region includes the entire region of the first light-shielding region, and the second light-shielding region has an area which is greater than that of the first light-shielding region; and forming the second pattern on a photo-mask substrate to form a photo-mask, wherein the photo-mask is used in an ion implantation process of a material layer.

14 Claims, 10 Drawing Sheets

(51) Int. Cl.
*H01L 21/027* (2006.01)
*H01L 21/266* (2006.01)
*G03F 1/00* (2012.01)

(56) References Cited

U.S. PATENT DOCUMENTS

| | | | | |
|---|---|---|---|---|
| 4,343,878 | A * | 8/1982 | Chiang | G03F 9/7076 |
| | | | | 430/22 |
| 5,702,868 | A * | 12/1997 | Kellam | G03F 7/2022 |
| | | | | 257/E21.026 |
| 2004/0248020 | A1 * | 12/2004 | Fujikawa | G03F 1/00 |
| | | | | 430/22 |
| 2008/0128762 | A1 * | 6/2008 | Vora | H01L 29/808 |
| | | | | 257/288 |
| 2012/0280364 | A1 * | 11/2012 | Kato | G03F 1/38 |
| | | | | 257/618 |
| 2013/0084685 | A1 * | 4/2013 | Fang | H01L 21/266 |
| | | | | 438/301 |
| 2014/0061858 | A1 * | 3/2014 | Lin | H01L 29/73 |
| | | | | 257/565 |
| 2018/0321581 | A1 * | 11/2018 | Chou | G03F 1/68 |

FOREIGN PATENT DOCUMENTS

| | | | | |
|---|---|---|---|---|
| JP | 10-253986 | * | 9/1998 | G02F 1/136 |
| TW | 201236050 A | | 9/2012 | |

OTHER PUBLICATIONS

Faggin, "The making of the first microprocessor", IEEE Solid-state circuits magazine pp. 8-21 (2009).*

Tan, "Design, Fabrication and Characterization of N-Channel InGaAsP-InP Based Inversion Channel Technology Devices (ICT) for optoelectronic integrated circuits (OEIC): Double Heterojunction Optoelectronic Switches (DOES), Heterojunction Field Effect Transistors (HFET), Bipolar Inversion Channel Field-Effect Transistors (BIFET) . . . ", (1998).*

* cited by examiner

METHODS FOR FORMING A PHOTO-MASK AND A SEMICONDUCTOR DEVICE

CROSS REFERENCE TO RELATED APPLICATIONS

This application claims the benefit of China Patent Application No. 201710674588.2 filed on Aug. 9, 2017, entitled "METHODS FOR FORMING A PHOTO-MASK AND A SEMICONDUCTOR DEVICE" which is hereby incorporated herein by reference.

BACKGROUND

Field of the Invention

The invention relates to semiconductor manufacturing technologies, and in particular to methods for forming a layout pattern of a photo-mask and methods for forming a semiconductor device.

Description of the Related Art

In semiconductor manufacturing processes, photolithography is an important step in transferring the layout patterns of the integrated circuits (ICs) onto the semiconductor chips. Generally, the layout patterns of the photo-masks are first designed according to the layouts of the integrated circuits. Next, the layout patterns of the photo-masks are formed on the photo-masks. Then, the patterns on the photo-masks are transferred to scale on the photo-resist material layers located on the surfaces of the semiconductor chips in the photolithography process.

In addition, semiconductor devices and the manufacturing technologies used to produce them have developed greatly during the past decades, allowing the size of the circuit to become smaller and much more complicated. In the photolithography process, reducing the critical dimension and improving the process window are the main purposes at present.

BRIEF SUMMARY

Some embodiments of the disclosure provide a method for forming a photo-mask used in an ion implantation process of a material layer. The method includes providing a first pattern, wherein the first pattern includes a first light-transmitting region and a first light-shielding region. The method also includes transforming the first pattern into a second pattern, wherein the second pattern includes a second light-transmitting region and a second light-shielding region, the second light-transmitting region is located within range of the first light-transmitting region, and the second light-transmitting region has an area that is smaller than that of the first light-transmitting region, the second light-shielding region includes the entire region of the first light-shielding region, and the second light-shielding region has an area that is greater than that of the first light-shielding region. The method further includes forming the second pattern on a photo-mask substrate to form a photo-mask.

Some embodiments of the disclosure provide a method for forming a photo-mask used in an ion implantation process of a material layer. The method includes providing a first pattern, wherein the first pattern includes a first light-transmitting region and a first light-shielding region. The method also includes transforming the first pattern into a second pattern, wherein the second pattern includes a second light-transmitting region and a second light-shielding region, the second light-shielding region is located within range of the first light-shielding region, and the second light-shielding region has an area which is smaller than that of the first light-shielding region, the second light-transmitting region includes the entire region of the first light-transmitting region, and the second light-transmitting region has an area which is greater than that of the first light-transmitting region. The method further includes forming the second pattern on a photo-mask substrate to form a photo-mask.

Some embodiments of the disclosure provide a method for forming a semiconductor device. The method includes providing a photo-mask formed by the aforementioned method, the photo-mask has a light-shielding pattern and a light-transmitting region outside of the light-shielding pattern, wherein the light-shielding pattern corresponds to the second light-shielding region of the aforementioned second pattern, the light-transmitting region corresponds to the second light-transmitting region of the aforementioned second pattern, the light-transmitting region is surrounded by the light-shielding pattern, and the light-shielding pattern extends to an edge of the photo-mask. The method also includes forming a material layer on a semiconductor substrate, forming a mask layer on the material layer, and forming a photo-resist layer on the mask layer. The method further includes exposing the photo-resist layer by using the photo-mask, and developing the exposed photo-resist layer to form a patterned photo-resist. In addition, the method includes patterning the mask layer by using the patterned photo-resist to form a patterned mask, and performing an ion implantation process to the material layer by using the patterned mask.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIGS. 3A to 3D are cross-sectional views illustrating intermediate stages of a method for forming a semiconductor device in accordance with some embodiments, wherein FIGS. 3A to 3D are cross-sectional views corresponding to line 3-3 of the photo-mask in the top view of FIG. 2C.

DETAILED DESCRIPTION OF THE INVENTION

Figure 1A:
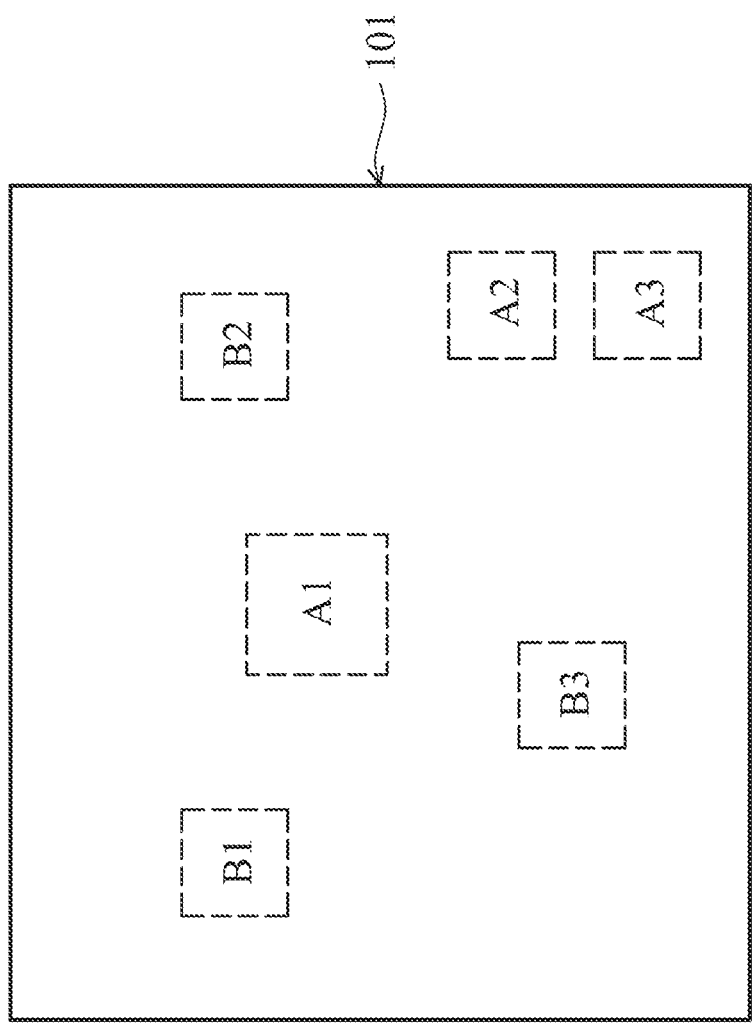
FIGS. 1A to 1C are top views illustrating intermediate stages of a method for forming a layout pattern of a photo-mask in accordance with some embodiments.

As shown in FIG. 1A, first regions A1, A2, A3 and second regions B1, B2, B3 are labeled in a pattern design region 101 of a photo-mask, in accordance with some embodiments. The first regions A1, A2, A3 and the second regions B1, B2, B3 respectively correspond to the location of target elements of a semiconductor device (for example, active areas, gates, contact holes or a combination thereof) in the subsequent processes, and each of the first regions A1, A2, A3 and each of the second regions B1, B2, B3 are independent regions, they are not connected to each other.

In the present embodiment, the first regions A1, A2 and A3 correspond to the regions of the material layer of the semiconductor device on which a manufacturing process is expected to be performed subsequently by using a photo-mask, and the second regions B1, B2 and B3 correspond to the regions of the material layer of the semiconductor device on which the manufacturing process is expected not to be performed subsequently. In addition, the regions outside of the first regions A1, A2, A3 and the second regions B1, B2, B3 of the pattern design region 101 correspond to the regions of the material layer of the semiconductor device on which the manufacturing process is expected to be optionally performed. In some embodiments, the aforementioned manufacturing process may be, for example, an ion implantation process.

Figure 1B:
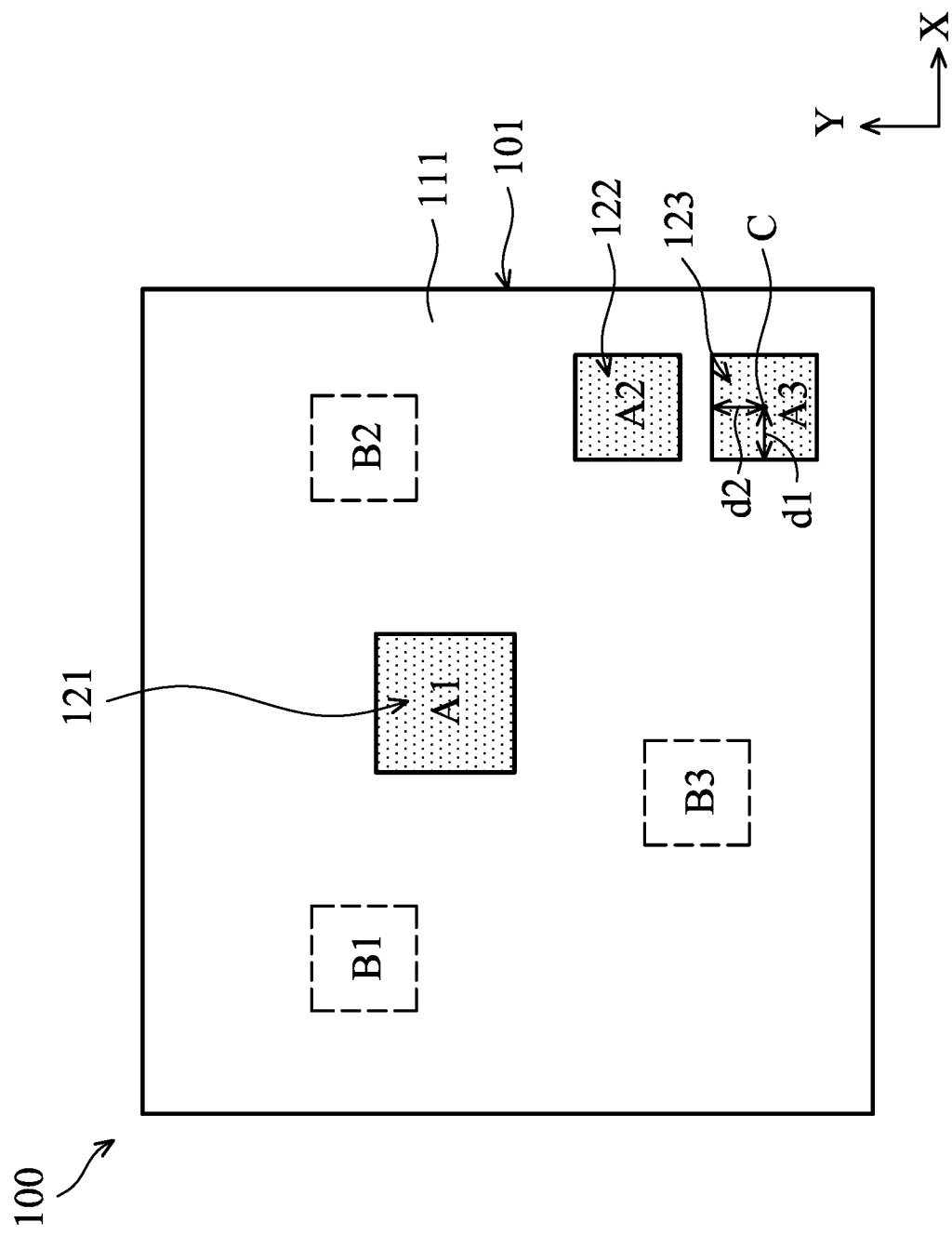

Next, as shown in FIG. 1B, a first pattern 100 is generated in the pattern design region 101. The first pattern 100 includes a first light-transmitting region 111 and a plurality of first light-shielding regions 121, 122, 123. In some embodiments, the first light-shielding regions 121, 122, 123 are separated from each other, and each of the first light-shielding regions 121, 122, 123 is surrounded by the first light-transmitting region 111. In addition, the first pattern 100 is a pattern design passing the design rule check (DRC) of the photo-mask layout.

It is worth noting that the first light-shielding regions 121, 122, 123 respectively correspond to the locations of the first regions A1, A2, A3, and the first light-shielding regions 121, 122, 123 at least include the entire regions of the first regions A1, A2, A3, respectively. In addition, the second regions B1, B2, B3 and the region outside of the first regions A1, A2, A3 and the second regions B1, B2, B3 of the pattern design region 101 are covered by the first light-transmitting region 111.

Figure 1C:
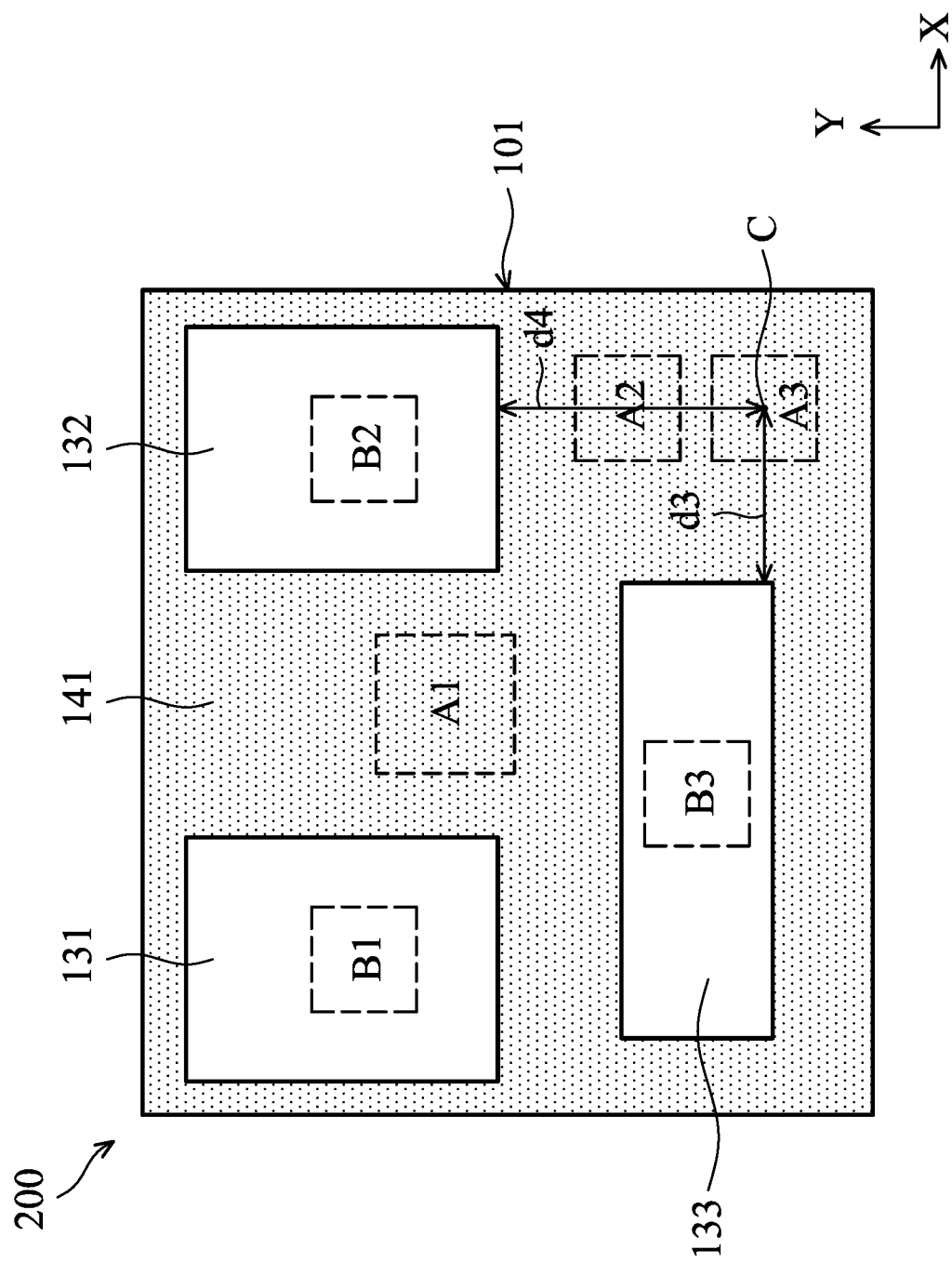

As shown in FIG. 1C, the first pattern 100 is transformed into a second pattern 200, in accordance with some embodiments. The second pattern 200 includes a second light-transmitting region 131, a third light-transmitting region 132, a fourth light-transmitting region 133 and a second light-shielding region 141. In some embodiments, the second light-transmitting region 131, the third light-transmitting region 132 and the fourth light-transmitting region 133 are separated from each other. The second light-transmitting region 131, the third light-transmitting region 132 and the fourth light-transmitting region 133 are surrounded by the second light-shielding region 141, and the second light-shielding region 141 extends to an edge of the second pattern 200. In addition, since the second pattern 200 is transformed from the first pattern 100, the second pattern 200 is also a pattern design passing the design rule check (DRC) of the photo-mask layout.

It is worth noting that the second light-transmitting region 131 corresponds to the location of the second region B1, and the second light-transmitting region 131 at least completely covers the second region B1. The third light-transmitting region 132 corresponds to the location of the second region B2, and the third light-transmitting region 132 at least entirely covers the second region B2. The fourth light-transmitting region 133 corresponds to the location of the second region B3, and the fourth light-transmitting region 133 at least entirely covers the second region B3. In addition, the second light-shielding region 141 includes the entire region of the first regions A1, A2, A3 and a portion of the regions outside of the first regions A1, A2, A3 and the second regions B1, B2, B3 of the pattern design region 101.

Referring to FIGS. 1B and 1C, the second light-transmitting region 131, the third light-transmitting region 132 and the fourth light-transmitting region 133 of FIG. 1C are located within range of the first light-transmitting region 111 of FIG. 1B. The sum of the areas of the second light-transmitting region 131, the third light-transmitting region 132 and the fourth light-transmitting region 133 is smaller than the area of the first light-transmitting region 111. On the other side, the second light-shielding region 141 includes the entire range of the first light-shielding regions 121, 122, 123, and the area of the second light-shielding region 141 is greater than the sum of the areas of the first light-shielding regions 121, 122, 123.

When the photo-mask formed by the first pattern 100 of FIG. 1B is used in the manufacturing process performed on the material layer of the semiconductor device, the target element region of the semiconductor device is too close to the patterned mask thereon which is formed by the first pattern 100. When the photo-mask formed by the second pattern 200 of FIG. 1C is used in the manufacturing process performed on the material layer of the semiconductor device, the target element region of the semiconductor device can be farther from the patterned mask thereon which is formed by the second pattern 200.

For example, referring to FIG. 1B, the first light-shielding region 123 of the first pattern 100 has exactly the same range as that of the first region A3. In the horizontal direction X, the central point C of the first region A3 and the first light-transmitting region 111 have a first distance d1 therebetween, and in the vertical direction Y, the central point C of the first region A3 and the first light-transmitting region 111 have a second distance d2 therebetween. Further, referring to FIG. 1C, the second light-shielding region 141 of the second pattern 200 includes the range of the first region A3. In the horizontal direction X, the central point C of the first region A3 and the fourth light-transmitting region 133 have a third distance d3 therebetween, and in the vertical direction Y, the central point C of the first region A3 and the fourth light-transmitting region 133 have a fourth distance d4 therebetween. In this embodiment, the second pattern 200 is compared with the first pattern 100, as a result, the third distance d3 is greater than the first distance d1, and the fourth distance d4 is greater than the second distance d2.

Since the third distance d3 and the fourth distance d4 of the second pattern 200 are greater than the first distance d1 and the second distance d2 of the first pattern 100, when the photo-mask formed by the second pattern 200 is used in the manufacturing process which is performed on the material layer of the semiconductor device, the target element region (such as A3) of the semiconductor device can be farther from the patterned mask thereon which is formed by the second pattern 200. Therefore, the target element in the target element region can be prevented from being affected by the pattern mask.

For example, in the manufacturing process of the semiconductor device, a portion of the patterned mask formed by, for example, a polymer material, may be easily dropped into the contact hole of the semiconductor device during the patterning process (such as the photolithography process) for forming the patterned mask, such that the conductivity of the contact subsequently formed in the contact hole is weak. As a result, the resistivity of the semiconductor device may be increased, which in turn becomes harmful to the performance of the semiconductor device. When the photo-mask formed by the second pattern 200 is used, the region of the contact hole formed in the semiconductor device can be farther from the patterned mask thereon which is formed by the second pattern 200, such that the material which is used to form the patterned mask, such as the polymer material or another mask material, can be prevented from dropping into the contact hole. Therefore, the increasing of the resistivity of the semiconductor device can also be avoided.

Moreover, when the target element region (such as the contact hole) of the semiconductor device is too close to the patterned mask thereon which is formed by the first pattern 100, a portion of the patterned mask may easily block the contact hole, which in turn causes an insufficient dose of ions to be implanted into the region of the semiconductor device below the contact hole, which is subsequently implanted through the contact hole. When the photo-mask formed by the second pattern 200 is used in the ion implantation process performed on the semiconductor device, the problem of the insufficient dose of ions caused by the blocking of the contact hole (the contact hole may be blocked by the patterned mask) can be overcome.

Still referring to FIG. 1C, a photo-mask is formed by the second pattern 200, and the photo-mask can be used in the manufacturing process of the semiconductor device, such as the ion implantation process performed on the material layer of the semiconductor device.

Figure 2A:
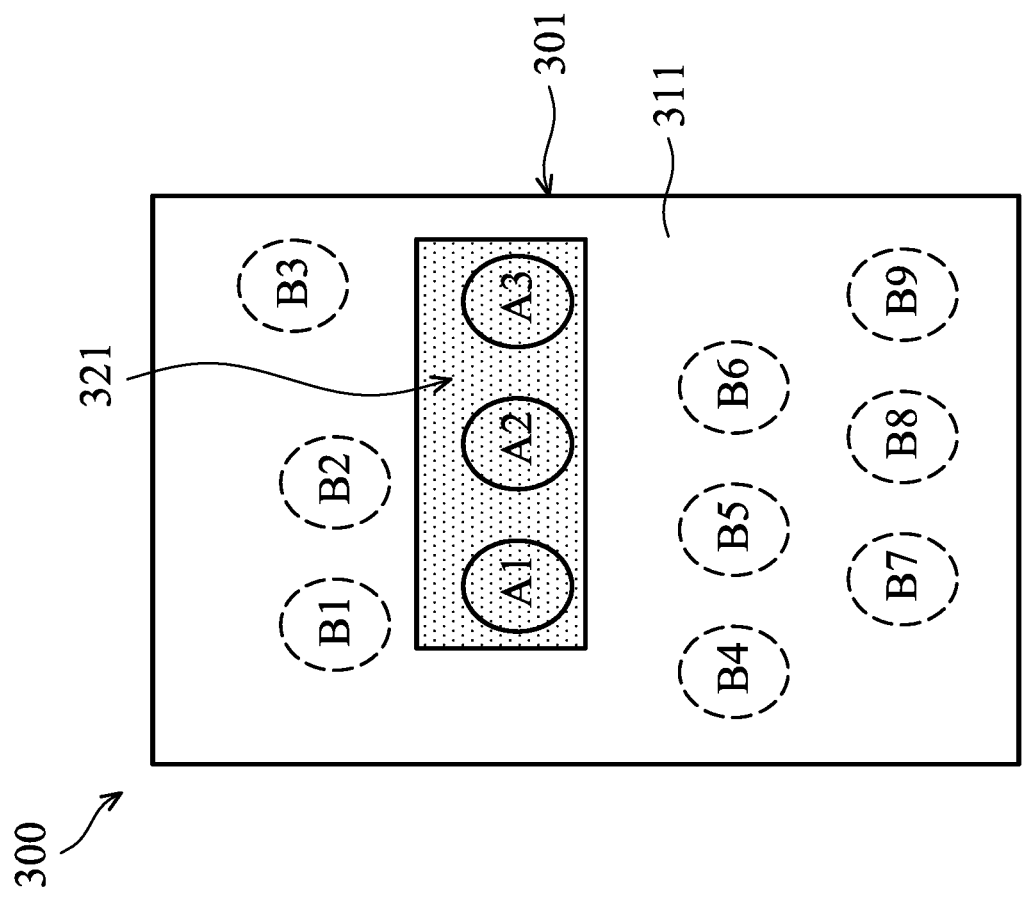
FIGS. 2A to 2C are top views illustrating intermediate stages of a method for forming a layout pattern of a photo-mask in accordance with some other embodiments.

As shown in FIG. 2A, first regions A1, A2, A3 and second regions B1, B2, B3, B4, B5, B6, B7, B8, B9 are labeled in a pattern design region 301 of a photo-mask, in accordance with other embodiments. The first regions A1-A3 and the second regions B1-B9 respectively correspond to the location of the target elements of the semiconductor device (for example, active areas, gates, contact holes or a combination thereof) in the subsequent processes, and each of the first regions A1-A3 and each of the second regions B1-B9 are independent regions, they are not connected to each other.

In the present embodiment, the first regions A1-A3 correspond to the regions of the material layer of the semiconductor device on which a manufacturing process is expected to be performed subsequently, and the second regions B1-B9 correspond to the regions of the material layer of the semiconductor device on which the manufacturing process is expected not to be performed subsequently. In addition, the region outside of the first regions A1-A3 and the second regions B1-B9 of the pattern design region 301 correspond to the region of the aforementioned material layer on which the manufacturing process is expected to be optionally performed. In some embodiments, the aforementioned manufacturing process may be, for example, an ion implantation process.

Referring to FIG. 2A, a first pattern 300 passing the design rule check (DRC) of the photo-mask layout is provided. The first pattern 300 includes a first light-transmitting region 311 and a first light-shielding region 321, and the first light-shielding region 321 is surrounded by the first light-transmitting region 311. In some embodiments, the first light-shielding region 321 at least includes the entire region of the first regions A1-A3, and the first light-transmitting region 311 at least includes the entire region of the second regions B1-B9.

Figure 2B:
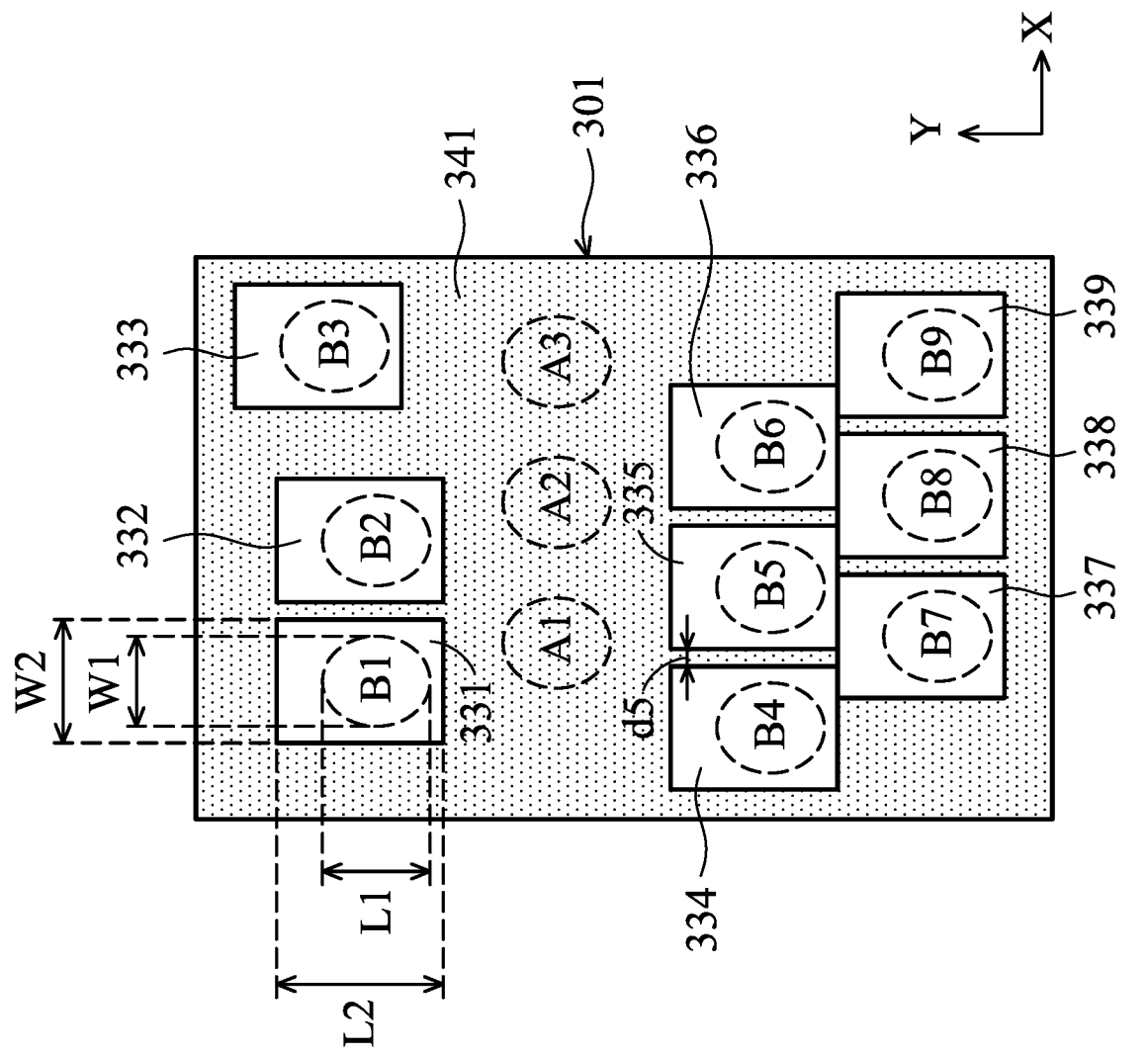

Next, the transformation of the first pattern 300 is shown in FIG. 2B. First, the first light-transmitting region 311 is divided into a plurality of sub-light-transmitting regions 331, 332, 333, 334, 335, 336, 337, 338, 339 according to the location of each of the second regions B1-B9, and the region outside of the sub-light-transmitting regions 331-339 is defined as a predetermined second light-shielding region 341. In some embodiments, the number of sub-light-transmitting regions 331-339 is equal to the number of second regions B1-B9, and the second regions B1-B9 are entirely covered by the sub-light-transmitting regions 331-339, respectively.

For example, the second region B1 has a first length L1 in the vertical direction Y and a first width W1 in the horizontal direction X. The sub-light-transmitting region 331 which covers the second region B1 has a second length L2 in the vertical direction Y and a second width W2 in the horizontal direction X. It is worth noting that the ratio of the second length L2 to the first length L1 and the ratio of the second width W2 to the first width W1 are at least 1.2, and the ratios can be modified according to the applicable requirements.

Referring to FIG. 2B, each of the sub-light-transmitting regions 331-339 has a distance between itself and the adjacent sub-light-transmitting regions 331-339, and every adjacent pair of the sub-light-transmitting regions 331-339 having an interval that is less than the minimum exposure interval (such as 380 nm) are merged together. In this embodiment, the sub-light-transmitting regions 334 and 335 have a distance d5 between them, and the distance d5 is less than the minimum exposure interval. Therefore, the sub-light-transmitting regions 334 and 335 are merged into the same light-transmitting region.

Figure 2C:
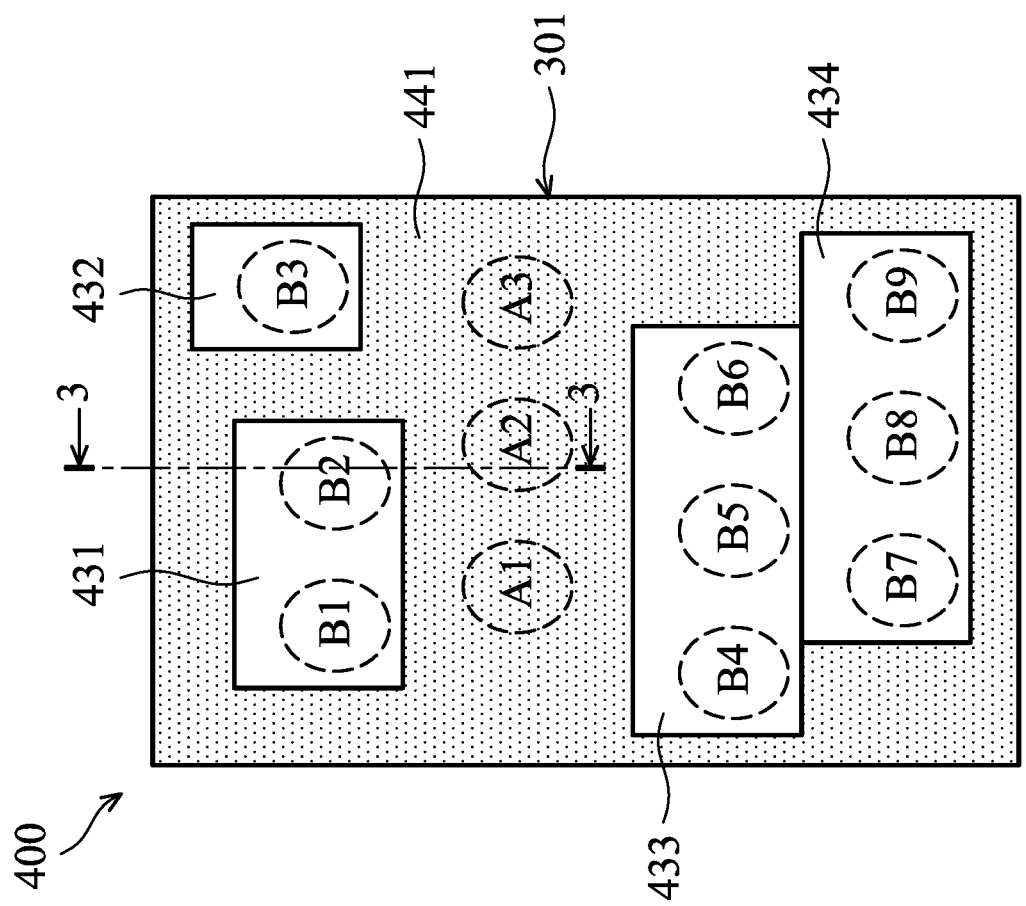

Referring to FIGS. 2B and 2C, the sub-light-transmitting regions 331 and 332 are merged into a second light-transmitting region 431, the sub-light-transmitting regions 334, 335 and 336 are merged into a fourth light-transmitting region 433, and the sub-light-transmitting regions 337, 338 and 339 are merged into a fifth light-transmitting region 434.

Moreover, since the distances between the sub-light-transmitting region 333 and other adjacent sub-light-transmitting regions 331, 332, 334-339 are greater than the minimum exposure interval, the sub-light-transmitting region 333 has no need to be merged with other sub-light-transmitting regions, so that the sub-light-transmitting region 333 can become a third light-transmitting region 432 of FIG. 2C individually. In the present embodiment, the area of the sub-light-transmitting region 333 is too small. To prevent the corresponding patterned photo-resist and the patterned mask from being hardly formed in the subsequently process because of the small area of the sub-light-transmitting region 333, the area of the sub-light-transmitting region 333 can be expanded outward appropriately to generate the third light-transmitting region 432. In addition, the area of the sub-light-transmitting region 333 can be expanded based on the premise that the distance between the sub-light-transmitting region 333 and the nearest first region A3 is enough.

As shown in FIG. 2C, after the sub-light-transmitting regions 331-339 are integrated and transformed, the second pattern 400 of the photo-mask is completed. The second pattern 400 includes the second light-transmitting region 431, the third light-transmitting region 432, the fourth light-transmitting region 433, the fifth light-transmitting region 434 and the second light-shielding region 441. The second light-shielding region 441 is the region outside of the second light-transmitting region 431, the third light-transmitting region 432, the fourth light-transmitting region 433 and the fifth light-transmitting region 434 of the pattern design region 301. In addition, since the second pattern 400 is transformed from the first pattern 300, the second pattern 400 is also a pattern design passing the design rule check (DRC) of the photo-mask layout.

In some embodiments, the second pattern 400 of FIG. 2C is formed on the photo-mask substrate to form a photo-mask, and the second light-shielding region 411 extends to the edge of the photo-mask.

Figure 3A:
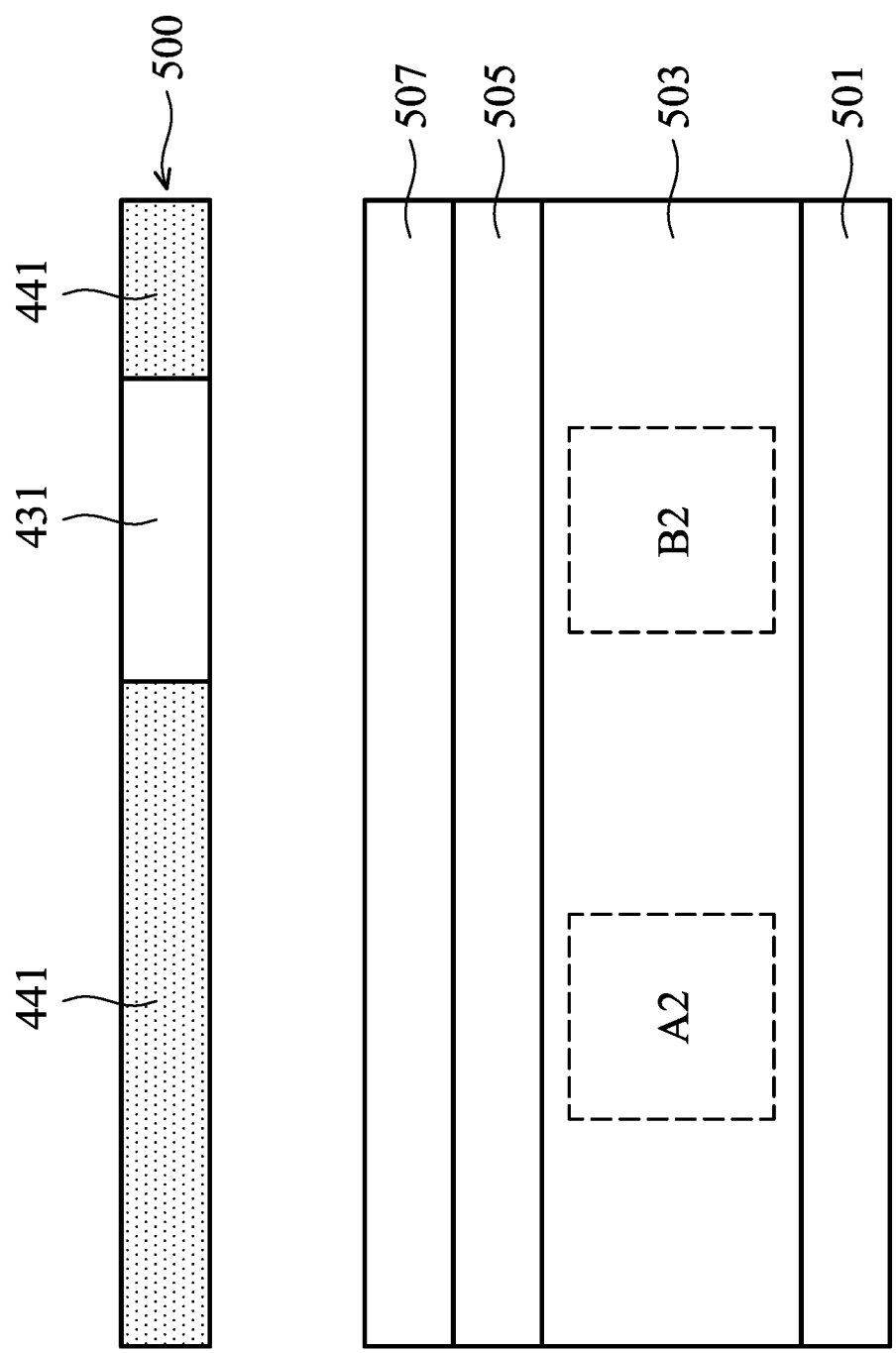

Methods for forming a semiconductor device by using the photo-mask formed by the second pattern 400 are provided below. Referring to FIG. 3A, a material layer 503, a mask layer 505 and a photo-resist layer 507 are sequentially formed on a semiconductor substrate 501.

In some embodiments, also referring to FIG. 2C, the material layer 503 is composed of first regions A1-A3, second regions B1-B9 and a third region (i.e. the region outside of the first regions A1-A3 and the second regions B1-B9). In some embodiments, an ion implantation process is performed on the first regions A1-A3, the ion implantation process is not performed on the second regions B1-B9, and the ion implantation process is optionally performed on the third region. It is worth noting that the target elements of the semiconductor device 600 (for example, active areas, gates, contact holes or a combination thereof) are located in the first regions A1-A3 and the second regions B1-B9 of the material layer 503, and the first regions A1-A3 and the second regions B-B9 respectively correspond to different target elements.

In some embodiments, the locations of the first regions A1-A3 and the third region of the material layer 503 correspond to that of the second light-shielding region 441 in the second pattern 400 of the photo-mask. The locations of the second regions B1 and B2 of the material layer 503 correspond to that of the second light-transmitting region 431 in the second pattern 400 of the photo-mask. The location of the second region B3 of the material layer 503 corresponds to that of the third light-transmitting region 432. The locations of the second regions B4-B6 of the material layer 503 correspond to that of the fourth light-transmitting region 433, and the second regions B7-B9 of the material layer 503 correspond to that of the fifth light-transmitting region 434.

Since FIG. 3A is a cross-sectional view along line 3-3 of the photo-mask in the top view of FIG. 2C, the material layer 503 of FIG. 3A only shows the first region A2, which the ion implantation process is performed on, and the second region B2, which the ion implantation process is not performed on.

Figure 3B:
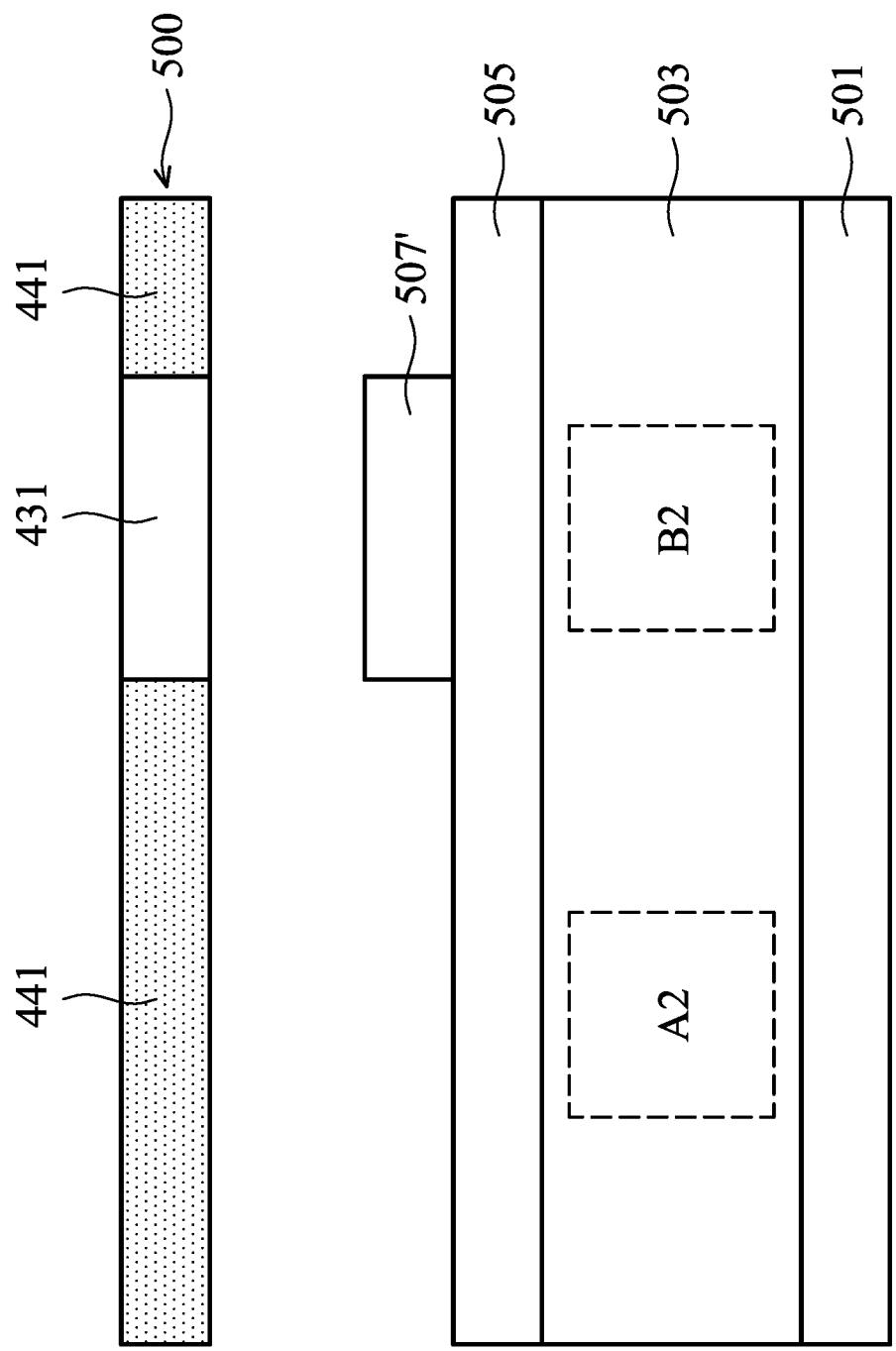

Next, as shown in FIGS. 3A and 3B, the photo-resist layer 507 is exposed by the photo-mask 500 formed by the second pattern 400, and a developing process is performed on the exposed photo-resist layer 507 to form a patterned photo-resist 507' as shown in FIG. 3B. Then, as shown in FIGS. 3B and 3C, a patterning process (such as an etching process) is performed on the mask layer 505 by utilizing the patterned photo-resist 507' to form a patterned mask 505' as shown in FIG. 3C.

Figure 3C:
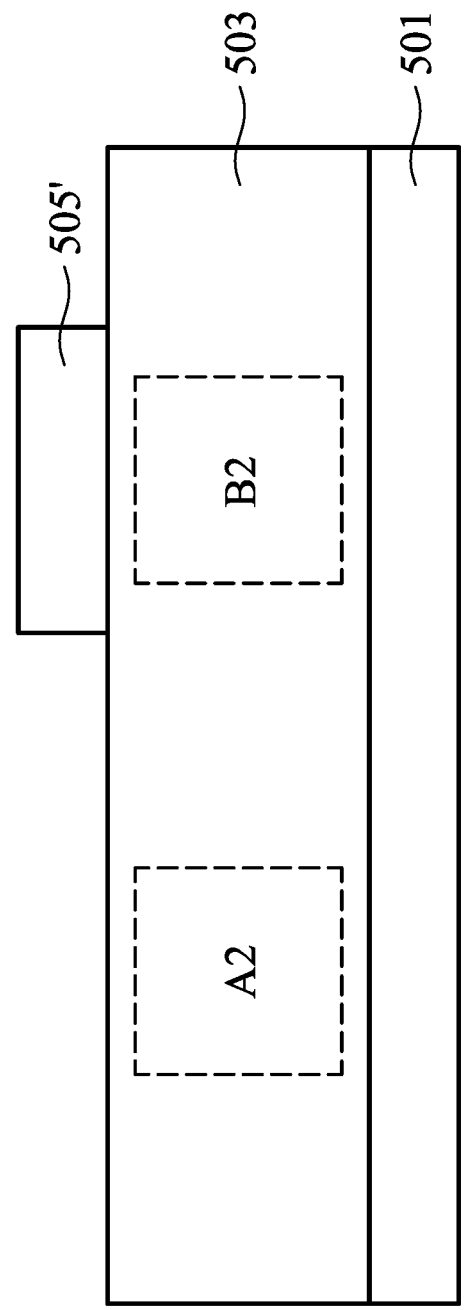

Referring to FIGS. 3B and 3C, since the second light-shielding region 441 of the second pattern 200 extends to the edge of the photo-mask 500, when a negative photo-resist is used as the photo-resist layer 507, the patterned photo-resist 507' and the patterned mask 505' formed by the photo-mask 500 are not extended to the edge of the material layer 503. In contrast, when a positive photo-resist is used as the photo-resist layer 507, the locations of the light-shielding pattern (such as the second light-shielding region 441) and the light-transmitting region (such as the second light-transmitting region 431) of the photo-mask 500 can be exchanged. For example, the second light-shielding region 441 can become a light-transmitting region, and the second light-transmitting region 431, the third light-transmitting region 432 and the fourth light-transmitting region 433 can become a light-shielding region. As a result, the patterned photo-resist 507' formed from the positive photo resist layer 507 by using the photo-mask having exchanged patterns and the patterned mask 505' formed subsequently do not extend to the edge of the material layer 503, either.

Figure 3D:
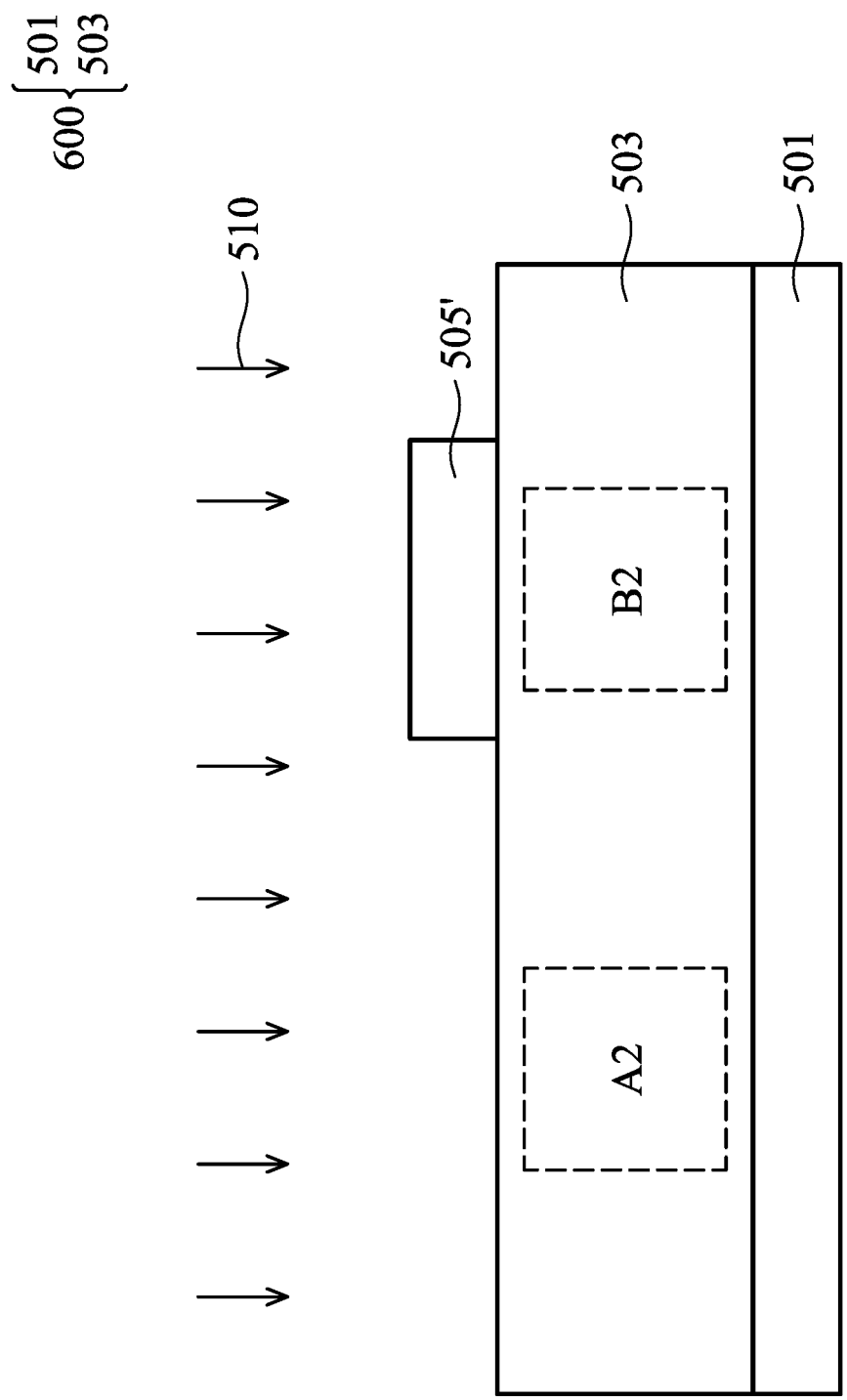

Next, as shown in FIG. 3D, an ion implantation process 510 is performed on the material layer 503 by utilizing the patterned mask 505', so that the ions are implanted into the first region of the material layer 503 (such as the first region A2) and the third region of the material layer 503 (such as the region of the material layer 503 outside of the first regions A1-A3 and the second regions B1-B9). After the ion implantation process 510 is performed, the patterned mask 505' is removed, and the semiconductor device 600 includes the semiconductor substrate 501 and the material layer 503 is completed.

In the embodiments using the negative photo-resist as the photo-resist layer 507 and using the layout pattern of the photo-mask formed by the second pattern 400, the second region B2 of the material layer 503 is covered by the patterned mask 505', and the first region A2 and the third region of the material layer 503 are not covered by the patterned mask 505'. In some embodiments, in comparison with the first region A2 of the material layer 503, the patterned mask 505' is closer to the second region B2 of the material layer 503.

Some embodiments of the disclosure provide a method by transforming a first pattern passing the design rule check (DRC) of the photo-mask layout into a second pattern which is another pattern passing the design rule check (DRC) of the photo-mask layout, such that the target element region of the semiconductor device can be farther from the patterned mask thereon which is formed by the second pattern. Therefore, the target element can be prevented from being affected by the pattern mask. Moreover, in comparison with the distance between the light-transmitting region of the first pattern and the target element region, the distance between the light-transmitting region of the second pattern and the target element region is farther. Thus, the photo-mask formed by the second pattern can have a higher process window and can generate a photo-resist layer having a smaller step height. Furthermore, in comparison with the photo-mask formed by the first pattern, the photo-mask formed by the second pattern has no need to use exposure machines with high resolution, so that the process cost can be decreased. In addition, the luminous flux passing through the photo-mask can be decreased, and the lens heating effect can be prevented from occurring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photo-mask used in an ion implantation process of a material layer, comprising:
   providing a first pattern design, wherein the first pattern design comprises a first light-transmitting region and a first light-shielding region;

providing a second pattern design based on the first pattern design, wherein the second pattern design comprises a second light-transmitting region and a second light-shielding region, the second light-transmitting region is within range of the first light-transmitting region, and the second light-transmitting region has an area which is smaller than an area of the first light-transmitting region, the second light-shielding region includes the entire region of the first light-shielding region, and the second light-shielding region has an area which is greater than that of the first light-shielding region; and forming the photo-mask based on the second pattern design, wherein the material layer is composed of a first region, a second region and a third region, the ion implantation process is performed on the first region, the ion implantation process is not performed on the second region, and the ion implantation process is optionally performed on the third region;

the first light-transmitting region corresponds to the entire region of the second region and the entire region of the third region and the first light-shielding region corresponds to the entire region of the first region; and the second light-transmitting region corresponds to the entire region of the second region and a part of the third region, and second light-shielding region corresponds to the entire region of the first region and a remaining part of the third region, wherein providing the second pattern design based on the first pattern design further comprises:

reducing the first light-transmitting region to form a plurality of isolated sub-light-transmitting regions according to a location of the second region of the material layer; and merging every adjacent pair of the isolated sub-light-transmitting regions separated by an interval that is less than a minimum exposure interval into the second light-transmitting region of the second pattern design.

2. The method as claimed in claim 1, wherein the first light-shielding region is surrounded by the first light-transmitting region, and the second light-transmitting region is surrounded by the second light-shielding region.

3. The method as claimed in claim 1, wherein the second pattern design further comprises a third light-transmitting region, the third light-transmitting region is located within range of the first light-transmitting region, and the third light-transmitting region is not connected to the second light-transmitting region.

4. The method as claimed in claim 3, wherein a sum of the area of the second light-transmitting region and an area of the third light-transmitting region is smaller than the area of the first light-transmitting region.

5. The method as claimed in claim 4, wherein an active area, a gate, or a contact hole of a semiconductor device or a combination thereof is located at the first region, and another active area, another gate, or another contact hole of the semiconductor device or a combination thereof is located at the second region.

6. A method for forming a semiconductor device, comprising:

forming a photo-mask formed by the method as claimed in claim 1, the photo-mask has a light-shielding pattern and a light-transmitting region outside of the light-shielding pattern, wherein the light-shielding pattern corresponds to the second light-shielding region of the second pattern design, the light-transmitting region corresponds to the second light-transmitting region of the second pattern design, the light-transmitting region is surrounded by the light-shielding pattern, and the light-shielding pattern extends to an edge of the photo-mask;

forming a material layer on a semiconductor substrate;

forming a mask layer on the material layer;

forming a photo-resist layer on the mask layer;

exposing the photo-resist layer by using the photo-mask, and developing the exposed photo-resist layer to form a patterned photo-resist;

patterning the mask layer by using the patterned photo-resist to form a patterned mask; and performing an ion implantation process to the material layer by using the patterned mask.

7. The method as claimed in claim 6, wherein the photo-mask further comprises an additional light-transmitting region, both the light-transmitting region and the additional light-transmitting region are surrounded by the light-shielding pattern, and the light-transmitting region is not connected to the additional light-transmitting region.

8. The method as claimed in claim 6, wherein the material layer is composed of a first region, a second region and a third region, the ion implantation process is performed on the first region, the ion implantation process is not performed on the second region, and the ion implantation process is optionally performed on the third region.

9. The method as claimed in claim 8, wherein an active area, a gate, or a contact hole of a semiconductor device or a combination thereof is located at the first region, and another active area, another gate, or another contact hole of the semiconductor device or a combination thereof is located at the second region.

10. The method as claimed in claim 8, wherein the light-shielding pattern corresponds to locations of the first region and the third region, and the light-transmitting region corresponds to a location of the second region.

11. The method as claimed in claim 8, wherein the photo-resist layer is a negative photo-resist, and the second region is covered and the first region and a portion of the third region are exposed by the patterned mask.

12. The method as claimed in claim 8, wherein the photo-resist layer is a negative photo-resist, and an area of the patterned mask covering the second region is at least 1.2 times an area of the second region.

13. A method for forming a photo-mask used in an ion implantation process of a material layer, comprising:

providing a first pattern design, wherein the first pattern design comprises a first light-transmitting region and a plurality of first light-shielding regions, the plurality of first light-shielding regions located in the first light-transmitting region;

providing a second pattern design based on the first pattern design, wherein the second pattern design comprises a second light-shielding region and a plurality of isolated second light-transmitting regions, the second light-shielding region covers the plurality of first light-shielding regions, the plurality of isolated second light-transmitting regions located in the second light-shielding region;

merging every adjacent pair of the plurality of isolated second light-transmitting regions separated by an interval that is less than a minimum exposure interval into one second light-transmitting region; and forming the photo-mask based on the second pattern design;

wherein the ion implantation process is performed on a plurality of first regions and the ion implantation process is not performed on a plurality of second regions, the first light-transmitting region exposes the plurality of second regions, each of the plurality of first light-shielding regions is independent of each other and covers at least one of the plurality of first regions, and each of the plurality of second light-transmitting regions is independent of each other and exposes at least one of the plurality of second regions.

14. The method as claimed in claim 13, wherein an active area, a gate, or a contact hole of a semiconductor device or a combination thereof is located at the plurality of first region, and another active area, another gate, or another contact hole of the semiconductor device or a combination thereof is located at the plurality of second region.

* * * * *